(12) United States Patent
Bluzer et al.

(10) Patent No.: US 7,326,977 B2
(45) Date of Patent: Feb. 5, 2008

(54) LOW NOISE FIELD EFFECT TRANSISTOR

(75) Inventors: Nathan Bluzer, Rockville, MD (US); Donald R. Lampe, Ellicott City, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 11/240,471

(22) Filed: Oct. 3, 2005

(65) Prior Publication Data
US 2006/0071249 A1 Apr. 6, 2006

Related U.S. Application Data

(60) Provisional application No. 60/614,972, filed on Oct. 4, 2004.

(51) Int. Cl.
*H01L 29/76* (2006.01)
(52) U.S. Cl. ............... 257/288; 257/372; 257/373; 257/375; 257/376; 257/403; 257/341
(58) Field of Classification Search ............ 257/403, 257/338, 288, 372, 373, 375, 376
See application file for complete search history.

(56) References Cited

U.S. PATENT DOCUMENTS 4,701,775 A * 10/1987 Cosentino et al. ......... 257/403
5,675,172 A    10/1997 Miyamoto et al.
5,899,732 A *  5/1999 Gardner et al. ........... 438/473
6,489,615 B2   12/2002 Bluzer
7,176,523 B2 * 2/2007 Hoshino et al. .......... 257/341
2002/0142566 A1* 10/2002 Ravi et al. ................ 438/458
2004/0126947 A1*  7/2004 Sohn ....................... 438/197

FOREIGN PATENT DOCUMENTS

EP    0 255 133    2/1988
EP    1 225 622    7/2002
JP    60-50960     3/1985

OTHER PUBLICATIONS

Streetman et al., Solid State Electronic Devices, 2000, Prentice Hall, 5th ed., pp. 423-437.*
Anonymous: "Low Noise Buried Channel Transistor", Research Disclosure, Mason Publications, Hampshire, GB, vol. 360, No. 53, Apr. 1994, XP007119725, ISSN:0374-4353.

* cited by examiner

*Primary Examiner*—Kenneth Parker
*Assistant Examiner*—José R. Diaz
(74) *Attorney, Agent, or Firm*—Andrews Kurth LLP

(57) ABSTRACT

An FET (field effect transistor) having source, drain and channel regions of a conductivity type in a semiconductor body of opposite conductivity type. The channel region is located at the lower extremity of the source and drain regions so as to be spaced from the surface of the semiconductor body by a distance d.

8 Claims, 3 Drawing Sheets

LOW NOISE FIELD EFFECT TRANSISTOR

CROSS-REFERENCE TO RELATED APPLICATIONS PRIORITY CLAIMED

The present application claims the benefit of priority of U.S. provisional patent application Ser. No. 60/614,972 filed on Oct. 4, 2004, which is hereby expressly incorporated by reference.

RELATED APPLICATIONS

This application is related to Non-provisional application Ser. No. 11/239,275, (Northrop Grumman Ref. No. 000775-078) entitled "Focal Plane Antenna to Sensor Interface For An Ultra-Sensitive Silicon Sensor" filed on Sep. 30, 2005; Non-provisional application Ser. No. 11/239,297, (Northrop Grumman Ref.: No. 000776-078), entitled "Ultra-Sensitive Silicon Sensor Readout Circuitry" filed on Sep. 30, 2005; and Non-provisional application Ser. No. 11/240,772 (Northrop Grumman Ref.: No. 000800-078), entitled "Sensitive Silicon Sensor and Test Structure for an Ultra-Sensitive Silicon Sensor", filed on Oct. 3, 2005.

CROSS REFERENCE TO RELATED ART

This application is also related to U.S. Pat. No. 6,489,615 entitled "Ultra-Sensitive Silicon Sensor", granted to Nathan Bluzer, the present inventor, on Dec. 3, 2002, and assigned to the assignee of this invention. U.S. Pat. No. 6,489,615 is intended to be incorporated herein by reference for any and all purposes.

BACKGROUND OF THE INVENTION

1. Field of the Invention

The invention in general relates to amplifier devices, and more particularly to an FET (field effect transistor) which exhibits low noise.

2. Description of Related Art

In some electronic systems, a signal is produced indicative of some parameter to be measured. Generally the signal level is low and one or more amplifier stages are provided to increase the signal level. If noise is present in an amplifier the signal is corrupted.

For example, an FET amplifier device exhibits several types of noise such as white noise and 1/f noise. White noise is a noise which is constant across frequency, while 1/f noise is frequency dependent. That is, the lower the frequency, the larger the fluctuation of that noise. Such 1/f noise may be due to trapping whereby mobile carriers in the FET are trapped resulting in larger current fluctuations and a consequent increase in noise. Such trapping occurs mostly at defects at the interface of the FET semiconductor body and a surface oxide coating.

This 1/f noise is particularly bothersome in, for example, solid state imaging arrays which operate at low frequencies where the 1/f noise is becoming more pronounced. Therefore the sensitivity of such imaging arrays is severely degraded and desired viewing in extremely low light levels is degraded by noise. A bipolar transistor, by virtue of its bulk design has low levels of 1/f noise. These bipolar transistors however are not impedance compatible with certain sensors, and conventional FET transistors exhibit objectionable trapping and 1/f noise.

It is therefore an object of the present invention to provide an FET which ameliorates the objectionable drawbacks of prior art devices,

SUMMARY OF THE INVENTION

An FET in accordance with the present invention includes a body of semiconductor material having a top surface with a first layer of a first conductivity type within the body and having a first dopant concentration. A second layer on the first layer is of the same conductivity type and has a dopant concentration less than that of the first layer. Spaced apart source and drain regions are formed within the body and are of an opposite conductivity type than the first and second layers. A channel region of the opposite conductivity type is connected to the source and drain regions at their lower extremity such that the channel region is spaced from the top surface by a distance d. A conductive well of the first conductivity type has a dopant concentration greater than that of the second layer, and extends from the top surface of the body to the first layer. An oxide coating is positioned on the top surface of the body, and a gate member is positioned on the oxide coating. Connections for applying bias potential to the conductive well and the source and drain regions are provided.

Further scope of applicability of the present invention will become apparent from the detailed description provided hereinafter. It should be understood, however, that the detailed description and specific example, while disclosing the preferred embodiment of the invention, is provided by way of illustration only, since various changes and modifications within the spirit and scope of the invention will become apparent to those skilled in the art, from the detailed description.

BRIEF DESCRIPTION OF THE DRAWINGS

The present invention will become more fully understood from the detailed description provided hereinafter and the accompanying drawings, which are not necessarily to scale, and are given by way of illustration only, and wherein.

DESCRIPTION OF THE PREFERRED EMBODIMENT

Figure 1:
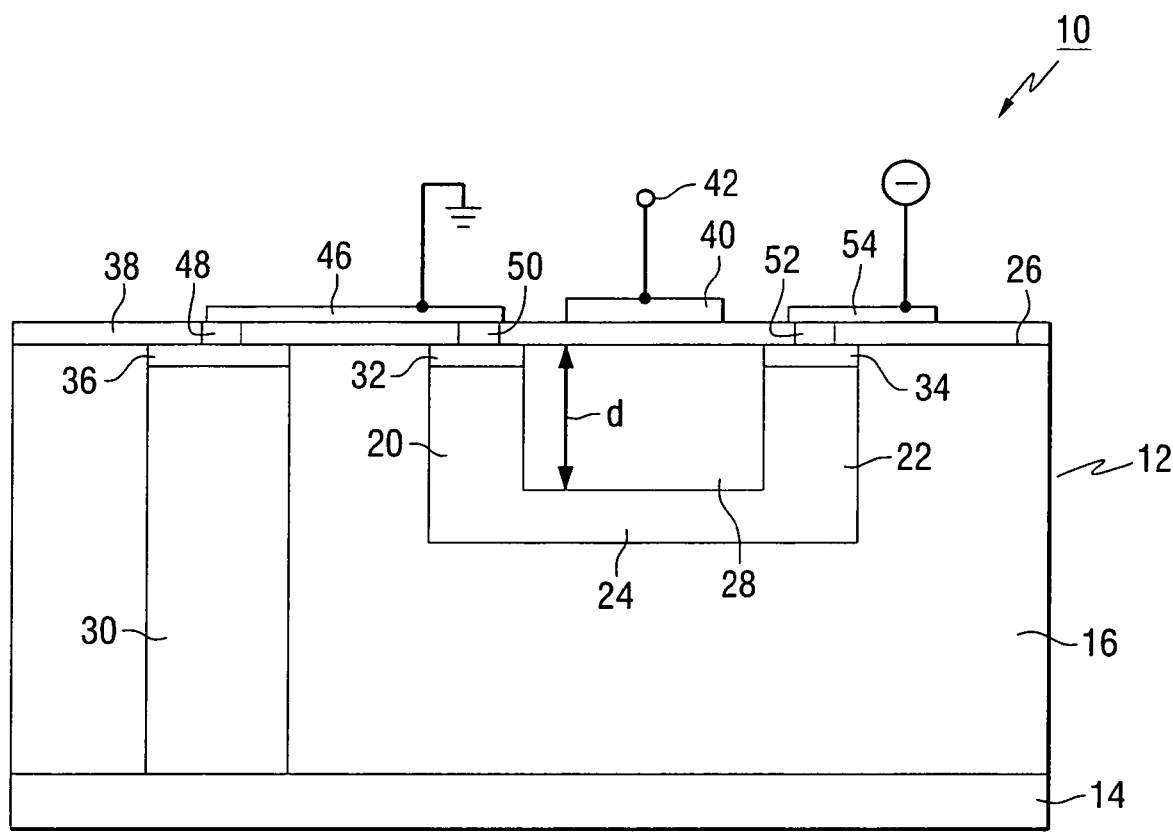
FIG. 1 is a side view of an FET in accordance with one embodiment of the present invention.
Figure 2:
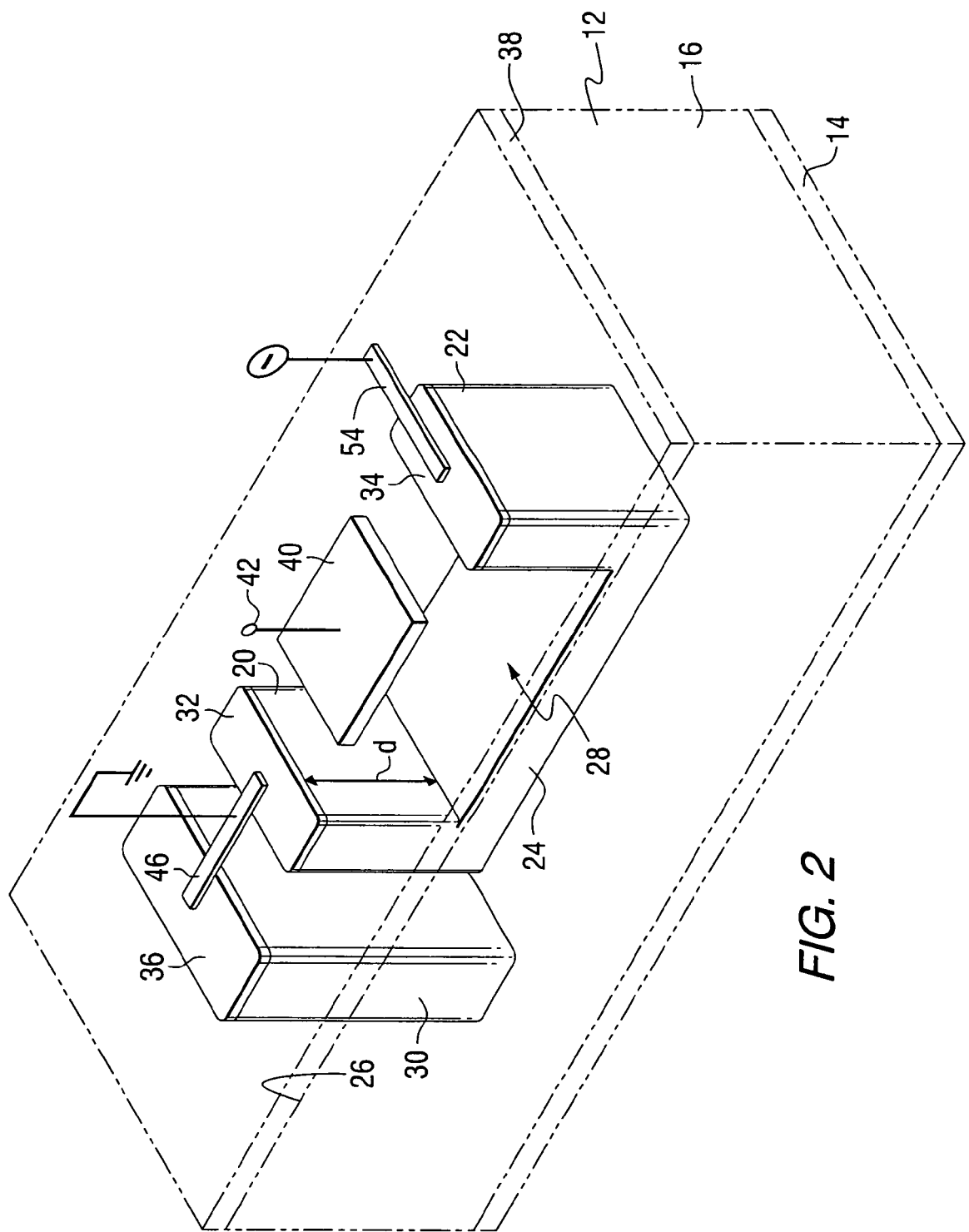
FIG. 2 is a perspective view of the FET.

Referring now to FIGS. 1 and 2, there is illustrated an FET 10 comprised of a two layer semiconductor body 12. Semiconductor body 12 includes a first layer 14 of a first conductivity type, for example N-type having a certain dopant concentration. The semiconductor body includes only a second layer 16 is of the same conductivity type as the first layer 14, however, with a dopant concentration less than that of the first layer 14. Typical dopant concentrations are $6 \times 10^{16}$ cm$^{-3}$ for layer 14 and $3.5 \times 10^{14}$ cm$^{-3}$ for layer 16.

Formed in a symmetrical structural arrangement within the semiconductor body 12, such as by ion implantation, are substantially like spaced apart source and drain regions 20 and 22 which are of an opposite conductivity type to that of the semiconductor body 12. That is, source and drain regions 20 and 22 are of P-type material. Extending between the source 20 and drain 22, at their lower extremity is a buried channel 24 of the same conductivity as the source 20 and drain 22. The arrangement is such that the P-type buried channel 24 is formed, above layer 14 and below surface 26, for example, by ion implantation, at a certain distance d away from the surface 26 of the semiconductor body 12, such that a certain volume 28 of opposite conductivity material exists between the top of P-type buried channel 24 and the surface 26.

Semiconductor body 12 also includes a well 30 formed by ion implantation coupled with a diffusion process. Well 30 is of the same conductivity type as the layer 16, that is, N-type, however with a higher dopant concentration, for example $10^{16}$ cm$^{-3}$. N-well 30 extends from the surface 26 of layer 16 down to the top of the first layer 14.

In order to make electrical connection to the source 20 and drain 22, an ion implantation of a high dopant concentration is performed on their surfaces to form respective P$^+$ contact surfaces 32 and 34. Similarly, an N$^+$ contact surface 36 is formed on N-well 30. Layer 16 is covered with an oxide layer 38 upon which is deposited a gate 40, which may be of a metal or polysilicon material, and which has an input 42.

In order to prevent the semiconductor body 12 from electrically floating during operation, the N-well 30 ensures that the semiconductor body 12 is tied to a predetermined potential. In the present example, this predetermined potential is ground. More particularly, the N$^+$ contact surface 36 of N-well 30 is electrically connected to the P$^+$ contact surface 32 of source 20 by a lead 46 which makes contact with the N$^+$ contact surface 36 by means of a metalized via 48, with the lead 46 making contact with P$^+$ contact surface 32 by means of a metalized via 50. In the present example, the source 20 is grounded. In a similar manner, metalized via 52, in conjunction with lead 54, serves to connect drain 22 with a negative bias voltage.

The P-type buried channel 24 and the N-type volume 28 above it each have a certain Fermi level associated with it. Basically, the Fermi energy level corresponds to an energy level about which the negative and positive charges are equal. Due to their different Fermi levels a potential difference exists between the P-type buried channel 24 and the N-type volume 28, and this tends to deplete the volume 28 of all of its mobile carriers, which for the N-type volume 28 are electrons. Thus, the volume 28 becomes positively charged.

Figure 3:
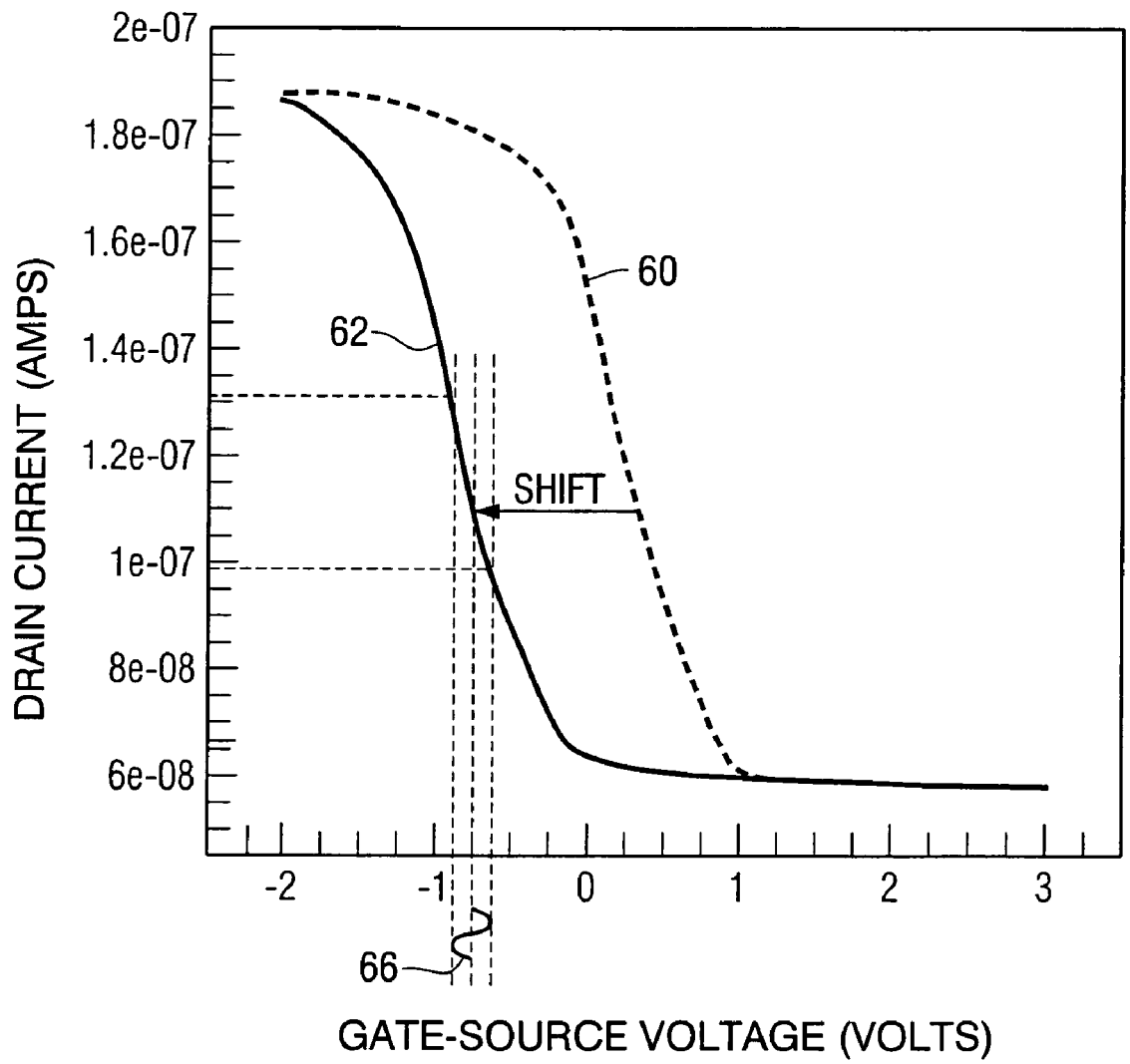
FIG. 3 illustrates a characteristic curve for the FET.

This positively charged volume 28 has the effect of altering the I-V (current-voltage) characteristic curve of the device, as illustrated in FIG. 3. Dotted curve 60 represents the I-V characteristics for a conventional buried channel FET. With the present invention, due to the positively charged volume 28, the characteristic curve is shifted to a position indicated by solid curve 62. In various electronic systems, circuitry or certain devices produce signals which must operate in the negative bias regime of the I-V curve. With the shifted I-V curve 62, the FET of the present invention is able to accommodate such signals.

For example, if a negative bias voltage of around −0.75 volts is applied to the FET gate input 42, a superimposed signal, as represented by waveform 66 will produce a corresponding drain current which ranges from around 0.098 μamps (microamps) to around 0.13 μamps.

A small saturation level is desired. The first layer 14, connected to ground via N-well 30 and source 20, pinches off, or depletes the buried channel 24 close to the drain at a voltage level whereby the saturation level occurs earlier than it normally would than without the first layer 14.

Thus with the FET of the present invention, majority carrier (holes) current between source and drain is confined to a channel region which is far below the surface of the device. With this arrangement surface trapping is minimized, and as result, 1/f noise is minimized leading to higher sensitivity devices. In situations where the circuitry dictates that an input signal operate in the positive regime of the I-V curve, the disclosed structure may be fabricated by reversing the N-type and P-type materials, and by putting a positive bias on the gate and drain.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. An FET, comprising:
 a two layer body of semiconductor material having a top surface; said body comprising a first layer of a first conductivity type and having a first dopant concentration;
 said body additionally comprising only a second layer on said first layer thereby constituting the remainder of said body and being of said same conductivity type and having a dopant concentration less than that of said first layer;
 substantially like spaced apart source and drain regions formed within said second layer in a symmetric structural arrangement and being of an opposite conductivity type than said first and second layers;
 an oxide coating on said top surface of said body;
 a buried channel region having a same said opposite conductivity type as said source and drain regions extending only between said source and drain regions at their lower extremity, said channel region being spaced below said top surface by a distance d, whereby a volume of semiconductor material of said same conductivity type as said second layer is provided between said source and drain regions and between a bottom surface of said oxide coating and a top surface of said buried channel region and a bottom surface of said oxide coating;
 a gate member on said oxide coating;
 a conductive well of said first conductivity type having a dopant concentration greater than that of said second layer located to the side of one region of said source and drain regions, and extending from said top surface of said body drain to a top surface of said first layer;
 connections for applying bias potential to said source and drain regions; and,
 a connection between said well and one region of said source and drain regions for connecting a predetermined potential to said first layer for preventing said body from electrically floating during operation.

2. An FET according to claim 1 wherein:
 said body, first and second layers and said conductive well are of an N-type semiconductor material; and
 said source, drain and channel regions are of a P-type semiconductor material.

3. An FET according to claim 2 wherein:
 said source region is connected to ground potential; and said conductive well is connected to said source region.

4. An FET according to claim 3 wherein:
 said drain region is connected to a negative potential.

5. An FET according to claim 1 wherein:
 the dopant concentration of said first layer is about 6×10$^6$ cm$^{-3}$; and
 the dopant concentration of said second layer is about 3.5×10$^{16}$ cm$^{-3}$.

6. An FET according to claim 5 wherein:
 the dopant concentration of said conductive well is about 10$^{16}$ cm$^{-3}$.

7. An FET according to claim 1 wherein:
the dopant concentration of said conductive well is about $10^{16}$ cm$^{-3}$.

8. An FET according to claim 1 wherein:
the dopant concentration of said first layer is about $6 \times 10^{16}$ cm$^{-3}$; and
the dopant concentration of said second layer is about $3.5 \times 10^{16}$ cm$^{-3}$; wherein:
the dopant concentration of said conductive well is about $10^{16}$ cm$^{-3}$.

* * * * *